United States Patent
Boulay et al.

(10) Patent No.: US 8,669,638 B2
(45) Date of Patent: Mar. 11, 2014

(54) HIGH POWER SEMICONDUCTOR DEVICE FOR WIRELESS APPLICATIONS AND METHOD OF FORMING A HIGH POWER SEMICONDUCTOR DEVICE

(75) Inventors: Jean Marie Boulay, Cugnaux (FR); Ayad Ghannam, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/129,936

(22) PCT Filed: Dec. 10, 2009

(86) PCT No.: PCT/IB2009/056029
§ 371 (c)(1),
(2), (4) Date: May 18, 2011

(87) PCT Pub. No.: WO2010/070626
PCT Pub. Date: Jun. 24, 2010

(65) Prior Publication Data
US 2011/0221033 A1 Sep. 15, 2011

(30) Foreign Application Priority Data
Dec. 16, 2008 (WO) .................. PCT/IB2008/055675

(51) Int. Cl.
*H01L 27/08* (2006.01)
*H01L 21/20* (2006.01)

(52) U.S. Cl.
USPC ............ 257/531; 257/E21.002; 257/E29.325; 438/381

(58) Field of Classification Search
CPC ............. H01L 2224/48091; H01L 2924/3011; H01L 24/49
USPC ........... 257/531, E21.002, E29.325; 438/381, 438/125, 329
See application file for complete search history.

(56) References Cited

U.S. PATENT DOCUMENTS 3,093,805 A * 6/1963 Osifchin et al. .................. 333/1
3,969,752 A * 7/1976 Martin et al. .................. 257/531
(Continued)

FOREIGN PATENT DOCUMENTS

| EP | 0818824 B1 | 5/2005 |
| GB | 2278017 A | 11/1994 |
| JP | 62-71904 | 5/1987 |
| JP | 63-274202 A | 11/1988 |
| JP | 11-298260 A | 10/1999 |
| WO | 2010/070390 A1 | 6/2010 |

OTHER PUBLICATIONS

Hacker Jonathan B et al: "Compact InP HBT Power Amplifiers Using Integrated Thick BCB Dielectrics" IEEE, Microwave Symposium, 2007, IEEE/MIT-S International, Honolulu, HI, Jun. 3-8, 2007, pp. 805-808.

(Continued)

*Primary Examiner* — Nikolay Yushin

(57) ABSTRACT

A high power semiconductor device for operation at powers greater than 5 watts for wireless applications comprises a semiconductor substrate including an active area of the high power semiconductor device, contact regions formed on the semiconductor substrate providing contacts to the active area of the high power semiconductor device, a dielectric layer formed over a part of the semiconductor substrate, a lead for providing an external connection to the high power semiconductor device and an impedance matching network formed on the semiconductor substrate between the active area of the high power semiconductor device and the lead. The impedance matching network includes conductor lines formed on the dielectric layer. The conductor lines are coupled to the contact regions for providing high power connections to the contact regions of the active area, and have a predetermined inductance for impedance matching.

20 Claims, 8 Drawing Sheets

(56) References Cited

U.S. PATENT DOCUMENTS

| | | | |
|---|---|---|---|
| 4,750,262 A * | 6/1988 | Mahmoud et al. | 29/832 |
| 5,355,102 A | 10/1994 | Kornrumpf et al. | |
| 5,532,512 A | 7/1996 | Fillion et al. | |
| 5,559,363 A | 9/1996 | Immorlica, Jr. | |
| 2004/0000676 A1 | 1/2004 | Fujioka et al. | |
| 2004/0241913 A1 | 12/2004 | McLaughlin et al. | |

OTHER PUBLICATIONS

Pulsford N J et al: "Passive Integration on SI for RF Circuits in Wireless Applications" IEEE, Microwave Symposium Digest, 1999, IEEE MIT-S International, Anaheim, CA, USA, Jun. 13-19, 1999, vol. 4, pp. 1897-1900.

Carchon G J et al: "High-Q Above-IC Inductors and Transmission Lines—Comparison to Cu Back-End Performance" IEEE, Electronic Components and Technology Conference, 2004, Proceedings, 54th, Jun. 1-4, 2004, vol. 1, pp. 1118-1123.

Carchon Greet J et al: "Wafer-Level Packaging Technology for High-Q On-Chip Inductors and Transmission Lines" IEEE, Transactions on Microwave Theory and Techniques, vol. 52, No. 4, Apr. 2004, pp. 1244-1251.

International Search Report and Written Opinion correlating to PCT/IB2009/056029 dated Mar. 17, 2010.

"Above-IC RF technology"; Imec Scientific Report 2007; 2007;6 Pages; www.imec.be.

* cited by examiner

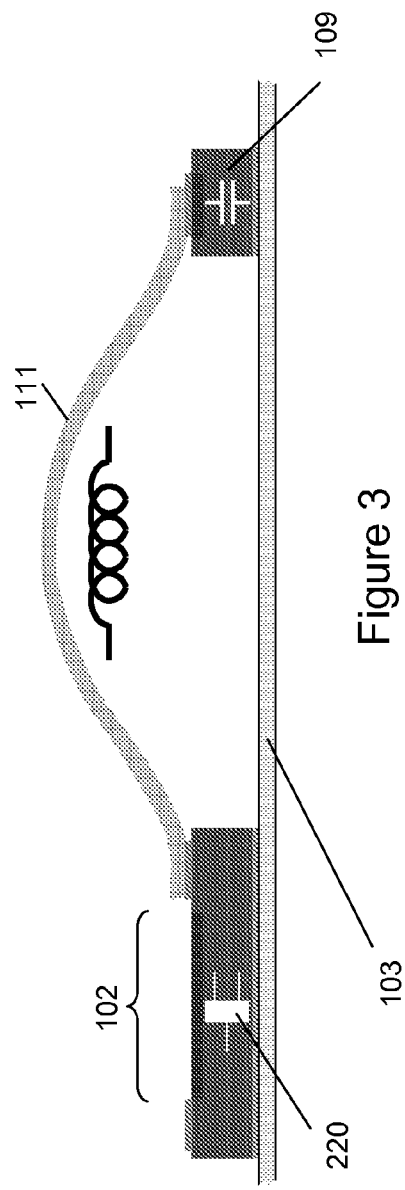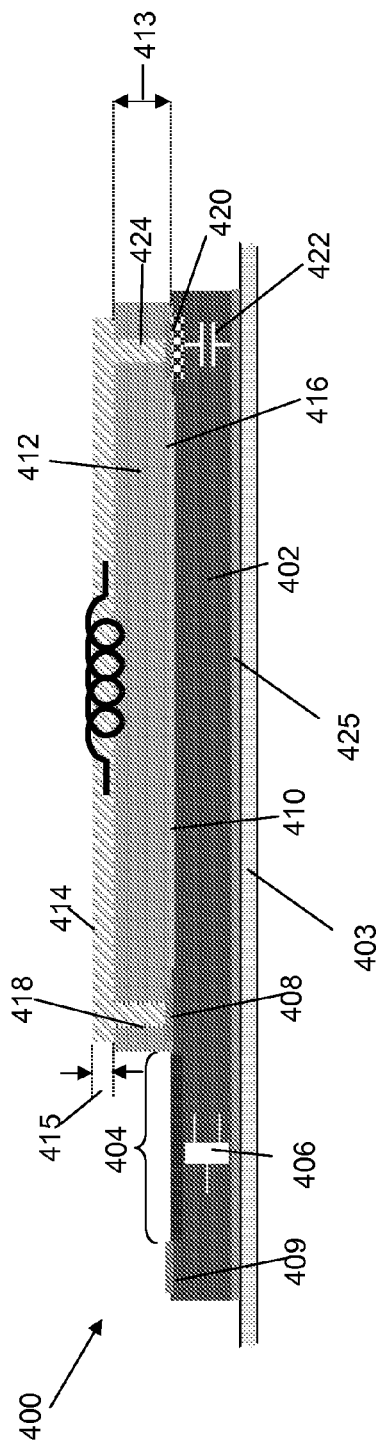

HIGH POWER SEMICONDUCTOR DEVICE FOR WIRELESS APPLICATIONS AND METHOD OF FORMING A HIGH POWER SEMICONDUCTOR DEVICE

FIELD OF THE INVENTION

This invention relates to high power semiconductor devices for wireless applications and methods of forming high power semiconductor devices for wireless applications.

BACKGROUND OF THE INVENTION

High power semiconductor devices, such as high power transistor devices and high power Integrated Circuits (ICs), are used in wireless devices and systems that are required to operate at high powers. For example, high power RF transistor devices are used in power amplifier devices of base stations of a cellular network and are required to have an operating range from greater than 5 Watts to several hundreds of Watts and at frequencies from a few MHz to several GHz.

Traditionally, the active area of the high power RF transistor device is formed on a semiconductor substrate and wires or wire bonds are used to connect the active area of the device to the input and output leads which form the external connections of the device and to impedance matching components in output and input impedance matching networks. The impedance matching networks are used in order to increase the input and output impedances of the power RF transistor device and bring them as close as possible to the required impedance (50Ω) over the operating power and frequency range. Impedance matching networks typically include capacitors that are generally printed on a semiconductor or insulating substrate and also, the wire bonds themselves which not only act as connections but also as inductors in the output and input impedance matching networks. The inductance of a wire bond is determined by the length, height and shape of the wire bond and the coupling between neighbouring wire bonds. Thus, the configuration of the wire bonds is selected along with the configuration of the other impedance matching components to ensure proper impedance matching at the input and output of the power RF transistor device. As an example, a 120/150 W power transistor device at 2 GHz requires currently more than 100 wire bonds of predetermined heights, lengths and shapes.

At high power and frequencies, any variations in the actual value of each inductor formed by each of the wire bonds, as well as the coupling with adjacent wire bonds, can affect the impedance matching provided by the impedance matching networks and hence the performance of the power device. Thus, in order to optimise the performance of a power device, the configuration (e.g. height, length and shape) of the wire bonds needs to be well controlled during manufacturing.

As new wireless communication systems are requiring more stringent and more repeatable performances to cope with linearized and high efficiency amplifier architectures, in order to meet the requirements of such systems, the amount by which variations in the actual inductance of the wire bonds due to manufacturing tolerances are acceptable will be reduced. For example, variations in the inductance of wire bonds formed by a wire bonding tool having a tolerance of +/− 50 µm (which is not an untypical level of tolerance for current tools) may result in the device failing the requirements of new systems.

An article entitled 'Passive Integration on Si for RF Circuits in Wireless Applications' by N J. Pulsford, J T M. van Beek, M H W M. van Delden, A. Boogaard, and R F. Milsom in Microwave Symposium Digest, 1999 IEEE MTT-S International, Volume 4, Issue 1999, Page(s): 1897-1900 describes integrating high quality factor inductors and capacitors on a high ohmic silicon substrate to form a passive integration die so as to provide the possibility of integrated low loss resonator and matching circuits in RF wireless applications. Such an arrangement includes a bottom metal layer (200 nm) formed on the high ohmic silicon substrate, a thin dielectric layer (200 nm) and a top metal layer (7 µm) formed over the dielectric layer. No active devices are integrated in the high ohmic silicon substrate. The passive integration die is combined with the active silicon die using standard multi-die packaging techniques.

By integrating the inductors and capacitors on a separate high ohmic die to the active area, a higher Q factor can be achieved which improves device performance. However, such an arrangement requires two separate dies with one die being formed of high ohmic silicon. This increases the cost and complexity of manufacture of such a device. Furthermore, the described integrated arrangement provides sufficient low loss performance due to the high ohmic substrate when the operating power is low (<3 W), but the dielectric and resistive losses of such an arrangement would be too high for higher powers (>5 W) due to the losses through the 200 nm dielectric layer and 7 µm metal line and so this arrangement of integrating inductors onto a die cannot be used in high power devices operating at powers greater than 5 W.

An article entitled 'Compact InP HBT Power Amplifiers Using Integrated Thick BCB Dielectrics' by J. Hacker, W. Ha, C. Hillman, M. Urteaga, R. Pierson and B. Brar describes using 15 µm thick layers of benzocyclobutane (BCB) dielectric to provide low loss millimeter-wave transmission lines with much smaller dimensions compared to conventional microstrip placed directly on the semiconductor substrate. The described technique is applied to low power (1.1 W) integrated circuits and cannot be used for high power devices (>5 W) for which resistive losses will be too high due to the thin metal layers (µm range or less). Thus, such an arrangement cannot be used in high power devices operating at powers greater than 5 W.

SUMMARY OF THE INVENTION

The present invention provides a high power semiconductor device for wireless applications and a method of forming a high power semiconductor device for wireless applications as described in the accompanying claims.

Specific embodiments of the invention are set forth in the dependent claims.

These and other aspects of the disclosure will be apparent from and elucidated with reference to the embodiments described hereinafter.

BRIEF DESCRIPTION OF THE DRAWINGS

Further details, aspects and embodiments of the disclosure will be described, by way of example only, with reference to the drawings. Elements in the figures are illustrated for simplicity and clarity and have not necessarily been drawn to scale.

FIG. 3 is a simplified cross-sectional view of a part of the high power semiconductor device shown in FIG. 1.

FIG. 4 is a simplified cross-sectional view of a part of an example high power semiconductor device in accordance with an embodiment of the disclosure.

DETAILED DESCRIPTION OF THE DRAWINGS

In the description that follows and in the Figures, certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present disclosure will be described with reference to a high power RF transistor device. It will be appreciated that the disclosure is not limited to transistor devices nor to RF devices and applies equally to other high power semiconductor devices, such as a high power RF or microwave integrated circuit, including for example two or more high power transistor devices on the same substrate.

Figure 1:
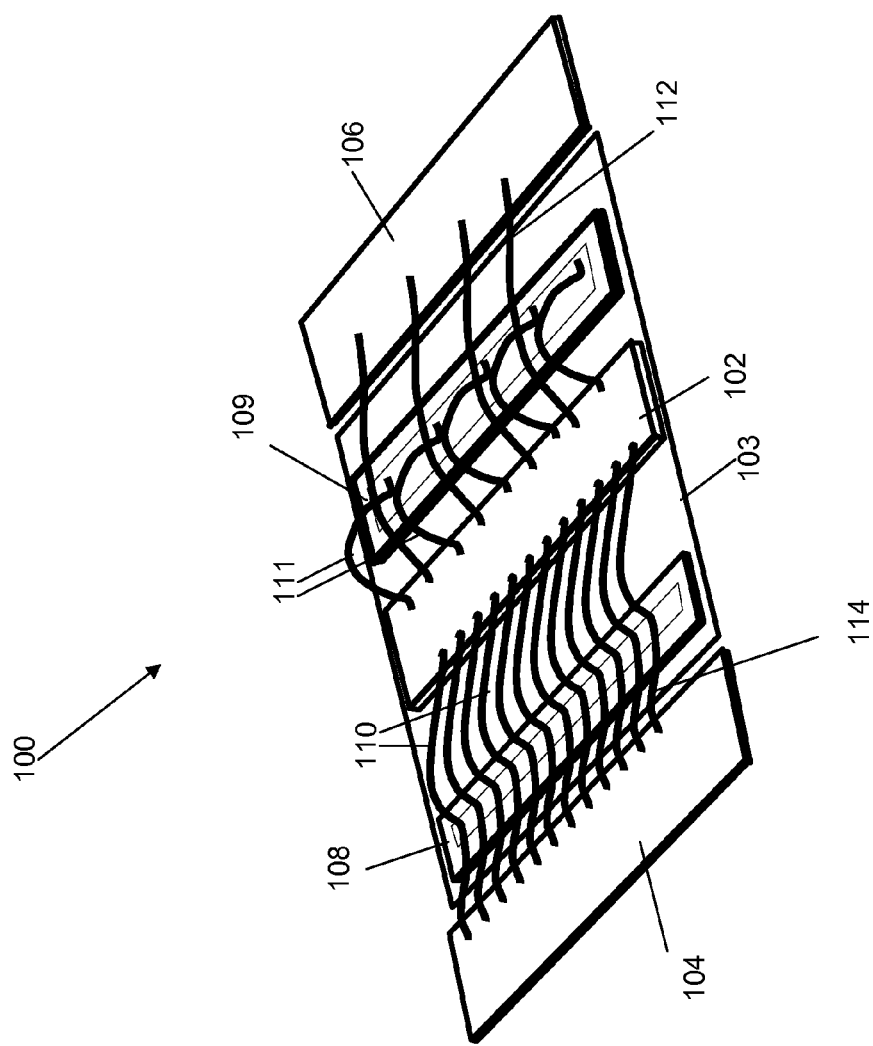
FIG. 1 is a simplified diagram of a top view of part of a known high power semiconductor device.

Referring firstly to FIG. 1, a traditional high power transistor device 100 includes an active area or die 102, an input lead 104 and an output lead 106 for enabling the device to be coupled to external components, capacitor devices 108, 109 as part of input and output impedance matching networks and wire bonds 110, 111 coupling the active area 102 to the capacitor devices 108, 109, wire bonds 112 coupling the active area 102 to the output lead 106, and wire bonds 114 coupling the capacitor device 108 to the input lead 104. Active area or die 102, capacitors 108 and 109 are attached on a metallic and conductive surface 103. In some cases, capacitors 108 and 109 may be formed on the same semiconductor substrate as the active area 102.

Figure 2:
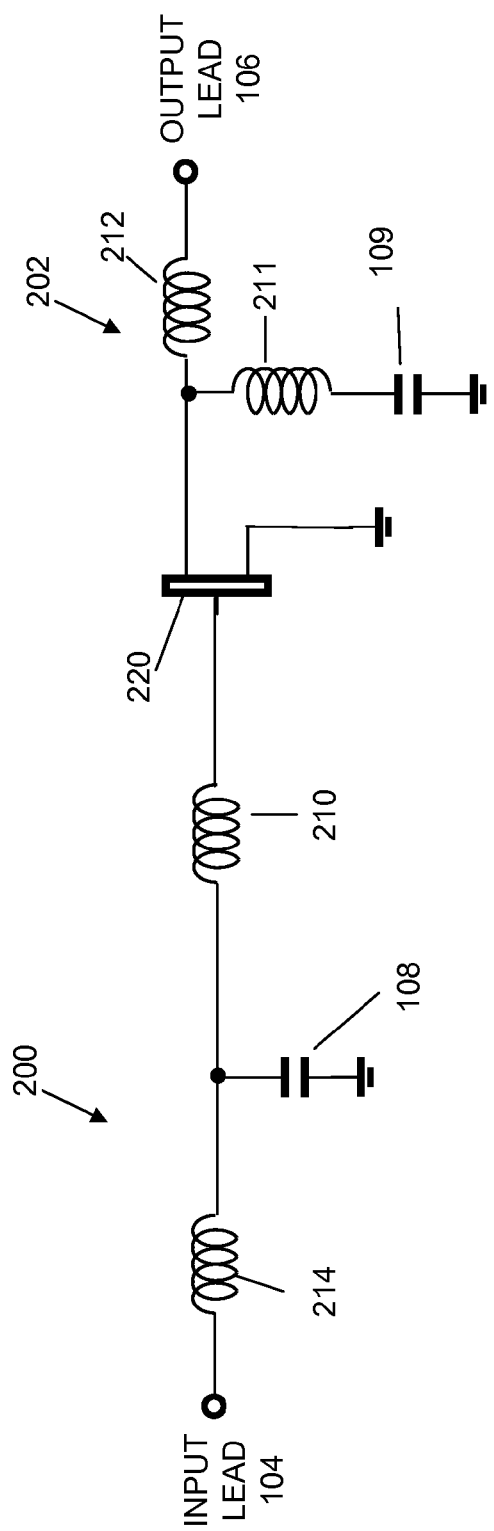
FIG. 2 a simplified equivalent electrical circuit diagram of the high power semiconductor device shown in FIG. 1.

FIG. 2 shows a simplified equivalent electrical circuit diagram of the part of the high power transistor device 100 shown in FIG. 1. The wire bonds 114, 110 act as inductors 214, 210 in an input impedance matching network 200 which also includes capacitor 108. The wire bonds 111 and 112 act as inductors 211, 212 in an output impedance matching network 202 which also includes capacitor 109.

FIG. 3 is a schematic cross section diagram of part of the high power transistor device 100 of FIG. 1. The active area or die 102 and the capacitor 109 are both attached (for example, soldered) to the metallic and conductive surface 103. The active area or die 102 includes regions and/or layers of various materials that provide the transistor functions represented by transistor 220 in FIG. 2 of the power transistor device 100. Wire bonds 111 provide a connection between the active area or die 102 (for example, the drain region of the transistor device 220) and the capacitor 109. The wire bonds 111 provide an inductive part of the output impedance matching of the device 100.

As the power at which the transistor device 100 operates increases, the impedance of the power device decreases and thus, for high power devices, improved performance can be achieved by arranging for the impedance matching to start close to the active area 102 of the device 100. This means that the variations in inductance of the wire bonds 110, 111 and 112 have a bigger effect on the impedance matching than variations in the wire bonds 114. In addition, connections to the leads, like wire 114, can be made very short in practise so that their variations in inductance are negligible.

As discussed in the introduction, the inductance of the wire bonds depends on the configuration of the wire bonds: that is, the height, the length, the shape of the wire bonds and the coupling between adjacent or neighbouring wire bonds. The actual value of the inductance of the wire bonds in the manufactured device may vary due to for example manufacturing variations and this can affect the impedance matching in the device 100. In order to ensure reliable device performance, the manufacture of the wire bonds, particularly those which are used as impedance matching components, should be controlled accurately.

Referring now to FIG. 4 which shows part of an example of a high power semiconductor device 400 for wireless applications in accordance with an embodiment of the disclosure. The high power semiconductor device shown in FIG. 4 comprises a semiconductor substrate 402 including an active area 404 of the high power semiconductor device. In the example shown in FIG. 4, the high power semiconductor device 400 is a RF power transistor device wherein the active area 404 includes regions and/or layers of various materials formed in the semiconductor substrate 402 that provide the transistor functions represented by the transistor symbol 406 in FIG. 4 of the power transistor device 400.

In an example, a conductive layer 425, such as a metallic layer, is provided on a bottom surface of the semiconductor substrate 402 and the metallic layer 425 is soldered or otherwise coupled to a conductive layer 403. The conductive layer 403 may be a metallic flange of the high power transistor device. The metallic layer 425 may be a ground plane.

As described herein, high power devices include devices capable of operating at power levels greater than 5 Watts and for wireless applications operating at frequencies from a few MHz to several GHz.

The high power semiconductor device 400 further comprises contact regions 408, 409 formed on the semiconductor substrate providing contacts to the active area of the high power semiconductor device. The contact region 408 shown in FIG. 4 may be, for example, a drain contact region and contact region 409 may be a gate contact region. Each of the contact regions 408, 409 may comprise a metal contact pad formed on a top surface 410 of the semiconductor substrate 402. The high power semiconductor device 400 may further comprise doped regions (not shown) formed in the semiconductor substrate 402 extending from the contact regions 408, 409 at the top surface 410 to provide improved ohmic contact. The high power semiconductor device 400 further comprises a dielectric layer 412 formed over a part of the semiconductor substrate, a or at least one lead (for example, lead 500, and/or lead 502 shown in FIG. 5) for providing an external connection to the high power semiconductor device 400 and an impedance matching network 510, 512 formed on the semiconductor substrate 402 between the active area 404 of the high power semiconductor device and the lead 500, 502. The impedance matching network 510, 512 includes conductor lines 414, only one of which is shown in FIG. 4, formed on the dielectric layer 412 and being coupled to the contact regions 408 for providing high power connections to the contact regions 408 of the active area 404 and having a predetermined inductance for impedance matching.

In the example shown in FIG. 4, the conductor line 414 is electrically connected to the contact region 408 by means of an opening or via 418 formed through the dielectric layer 412 extending to the contact region 408. Conductive material, such as a metal, formed in the opening 418 provides a conductive region for coupling the conductor line 414 to the contact region 408.

The high power semiconductor device 400 may further comprise a shielding layer 416 formed between the semiconductor substrate 402 and the dielectric layer 412 to reduce EM losses through the semiconductor substrate 402. In an example, the shielding layer 416 is a metallic layer, such as an aluminium layer, having a thickness around 1 micron. The shielding layer 416 may be formed on the top surface 410 of the semiconductor substrate 402 using the same process steps as those used for the top metallization for the high power semiconductor device 400 (e.g. the metal 2 process which is used to form the contact regions) or the same process steps as those used to form the conductor lines 414. The shielding layer 416 may or may not be connected to the bottom conductive layer 425. In some cases, by connecting the shielding layer 416 to the bottom conductive layer 425 which acts as a ground plane, the isolation of the semiconductor substrate 402 from the conductor lines can be improved which helps to reduce EM losses.

In the example shown in FIG. 4, the impedance matching network further comprises another impedance matching component formed on the semiconductor substrate 402 between the lead 500, 502 and the contact regions 408. The conductor line 414 extends at least between the contact regions 408 and the impedance matching component. In an example, the impedance matching component includes a capacitor formed on or as part of the semiconductor substrate 402 and represented by the capacitor symbol 422. The conductor line 414 provides a connection between the contact region 408 of the active area 404 and a contact region 420 of the capacitor 422. It will be appreciated that the conductor lines 414 may provide high power connections between the contact regions 408 of the active area 404 and at least another component of the impedance matching network and/or the lead 500, 502 which provides an external connection to the high power semiconductor device for enabling the device to be coupled to external components. Thus, the conductor lines 414 extend over a portion of the top surface 410 of the semiconductor substrate 402 and do not extend beyond or outside the top surface of the semiconductor substrate. The extent of the portion will depend on whether the conductor lines 414 are formed between just the contact regions 408 and other components of the impedance matching network or are formed between the contact regions 408 and the lead 500, 502 or are formed between the contact regions 408 and other components of the impedance matching network and between the other components of the impedance matching network and the lead 500, 502. Although not shown in FIG. 4, conductor lines formed on a dielectric layer in similar manner to conductor lines 414 and being coupled to the contact regions 409 of the active area 404 may provide high power connections between the contact regions 409 and components of impedance matching networks and/or a lead which provides an external connection to the high power semiconductor device. The dielectric layer 412 may or may not cover the active area 404 of the device 400.

In order to reduce the losses through the dielectric layer 412 and the semiconductor substrate 402 and the losses through the conductor lines 414 at high powers, configuration parameters of each of the dielectric layer 412 and conductive lines 414 are chosen so that the Q factor of the conductor lines 414 may exceed 40 at powers greater than 5 Watts and at 2 GHz with, for example, at least one of the conductor lines having an inductance of less than 1 nH (nano Henry). The configuration parameters of the dielectric layer 412 which have an impact on the Q factor include, for example, the thickness 413 of the dielectric layer 412, the permittivity of the material which forms the dielectric layer, and the loss tangent of the dielectric layer 412. The thickness is determined, for example, by simulation. The configuration parameters of the conductor lines 414 which have an impact on the Q factor include, for example, the area of the conductor lines 414 (e.g. the thickness 415), and the resistivity of the material which forms the conductor lines. As an example, the material of the conductor lines 414 is chosen so that the resistivity is as low as possible. The thickness is determined, for example, by simulation. Requirements for the configuration parameters of the dielectric layer 412 and conductive lines 414 may vary as a function of the resistivity of the semiconductor substrate 402, In an example which will be described in more detail below, the dielectric layer 412 may be formed on a silicon substrate and may comprise a layer of SU-8 dielectric material (a negative, epoxy-type, near-UV photoresist based on EPON SU-8 epoxy resin that is supplied by MicroChem Inc) having a thickness of greater than 60 microns and the conductor lines 414 are formed from copper and with at least one conductor line having a thickness of greater than 30 microns. In such a case, a Q factor of 40 at 2 GHz may be reached even on a very low resistivity semiconductor substrate (less than 0.05 ohm cm) and for power levels in excess of 100 Watts.

Figure 5:
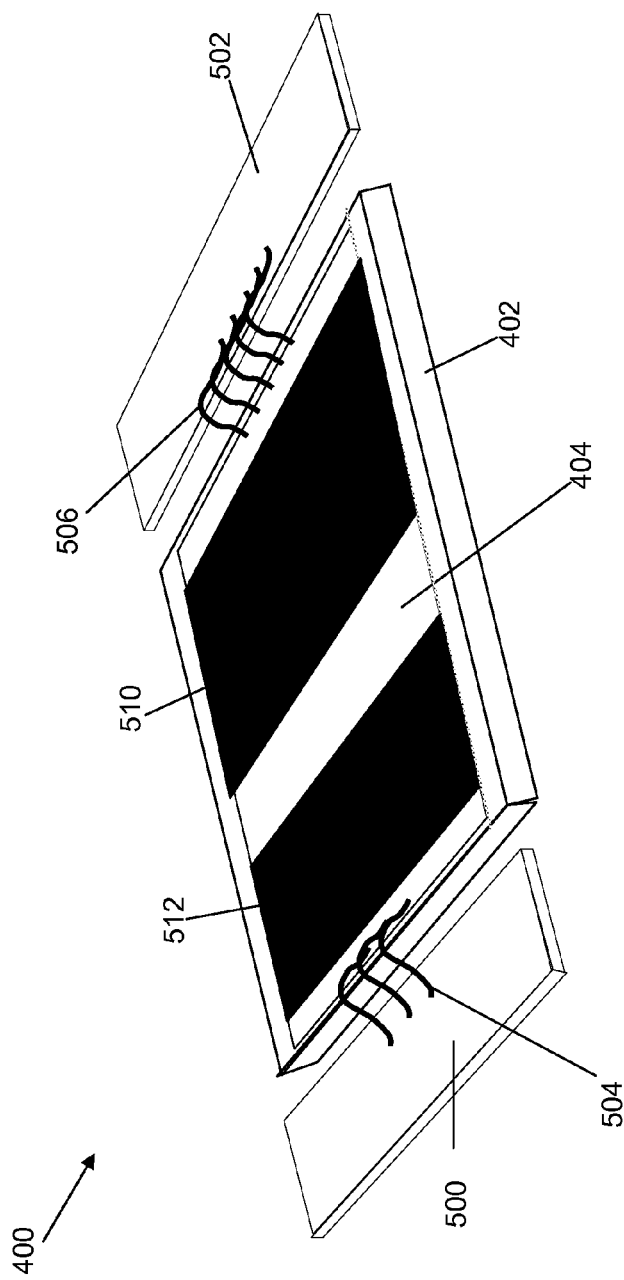
FIG. 5 is a simplified diagram of a top view of part of the example high power semiconductor device in accordance with an embodiment of the disclosure, part of which is shown in FIG. 4.

FIG. 5 is a simplified perspective view of an example of a high power semiconductor device 400, part of which is shown in FIG. 4, in accordance with an embodiment of the disclosure prior to the final processing steps which may include encapsulation and packaging. In the example shown in FIG. 5, the high power semiconductor device comprises an input lead 500 and an output lead 502 which provide external connections to the device 400, impedance matching network 512 formed between the input lead 500 and the active area 404 of the device 400, and impedance matching network 510 formed between the active area 404 of the device and the output lead 502. In an example, the impedance matching networks 510 and 512 are connected to the contact regions 408, 409 (shown in FIG. 4) of the active area 404 by means of conductor lines, such as lines 414 of FIG. 4. Due to the inductance of he conductor lines 414, the conductor lines 414 are components of the impedance matching networks 510, 512. The impedance matching networks 510, 512 may each further include at least one other impedance matching component such as capacitor 422 shown in FIG. 4 and/or further conductor lines, like conductor lines 414. The impedance matching components may include, additionally or alternatively to capacitors 422 formed on the semiconductor substrate 402, other components not shown in FIG. 5, such as further capacitors formed on the substrate 402. In the example shown in FIG. 5, the impedance matching networks 510, 512 are connected to the input 500 and output 502 leads via wire bonds 504 and 506 respectively. However, as discussed above the conductor lines 414 may provide high power connections between the contact regions of the active area 404 and other impedance matching components of the networks 510, 512 and/or the input 500 and/or output 502 leads.

The connections between the impedance matching networks 510 and 512 and the input 500 and output 502 leads are located further away from the active area 404 of the device and thus, have no or little impact on the impedance matching. In addition, these wires can be made very short, which further reduces their impact. Thus, wire bonds can be used for these connections or as discussed above, these connections may also be formed by conductor lines or by other means. However, the conductor lines 414 do not extend beyond or outside the top surface 410 of the semiconductor substrate 402.

As an alternative arrangement to wire bonds, an example arrangement (not shown) may have the lead extending over a portion of the top surface of the semiconductor substrate of the high power semiconductor device and beyond or outside the top surface to provide an external connection. The portion of the lead overlapping the semiconductor substrate may then be coupled to the semiconductor substrate, for example to the impedance matching network (e.g. the conductor lines or other components of the impedance matching network) which network is coupled to the contact regions. The coupling between the lead and semiconductor substrate (e.g. the impedance matching network) may be via ribbons, bumps (e.g. as in flip chip arrangements) or by a force (e.g. pressure) holding the lead in contact with a component of the impedance matching network or by any other suitable coupling means.

Each conductor line, such as conductor line 414 used in the impedance matching networks 510 and 512 in FIG. 5 has a certain inductance, as indicated by the inductor symbol used in FIG. 4. Thus, the conductor lines are used as connections to the active area 404 of the device and also as inductance impedance matching components which, with other impedance matching components (such as the capacitors 422) if used, provide impedance matching. The conductor lines are thus arranged to have a predetermined inductance for impedance matching. The predetermined inductance provided by the conductor lines 414 may depend on the number of the conductor lines used, the shape of each conductor line as it extends over the dielectric layer 412, the size of each conductor line (e.g. the width and length of each conductor line) and the nature and thickness of the dielectric layer 412. As an example, at least one of the conductor lines 414 may have a predetermined inductance less than 1 nano Henry. The predetermined inductance of at least one of the conductor lines 414 may be in the range of 100 pH (pico Henry).

Figure 6:
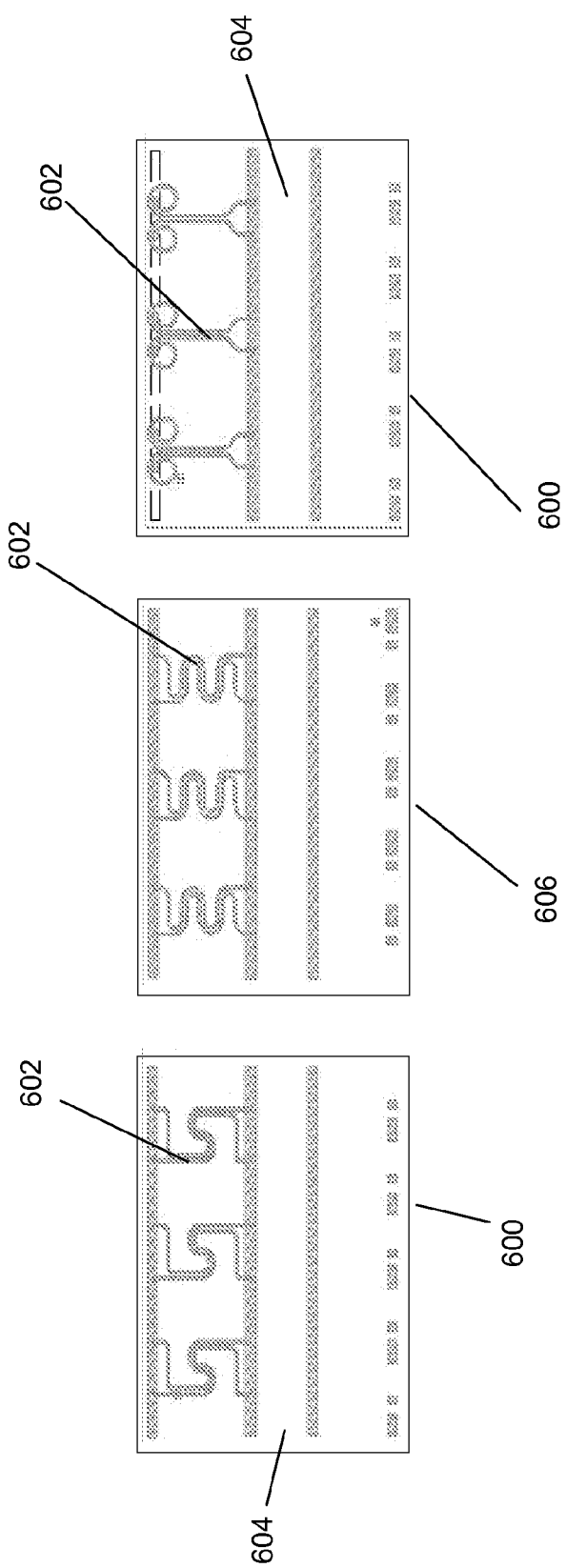
FIG. 6 is a simplified top view diagram of examples of part of the high power semiconductor device shown in FIG. 4 showing the conductor lines having different shapes.

FIG. 6 shows examples of different shapes that may be used for the conductor lines 414 of FIG. 4 as they extend over the dielectric layer 412. Conductor lines 602 are connected to the active area 604 of the semiconductor device 600. The shape used may be selected to optimise the coupling between adjacent conductor lines to provide the predetermined inductance. As is well known, the coupling between wires and lines can have an impact on the performance of a device. Typically, in order to optimise device performance, the configuration of adjacent wires or lines is arranged such that the coupling between adjacent different wires or lines is increased or decreased depending on requirement. Similarly, coupling between wires of different functionality and carrying different currents or signals can be adjusted as needed to improve device performance. For example, for the power semiconductor device designated by reference 606 in FIG. 6, at least two adjacent conductor lines 602 are situated in close proximity and have substantially the same shape such that the conductor lines 602 extend together in an s-shape serpentine path across the dielectric layer. The close proximity of the conductor lines 602 and the s-shape serpentine path are used in this example to increase the coupling between the conductor lines 602.

An example of a method of forming a high power semiconductor device for wireless applications in accordance with an embodiment of the disclosure will now be described with further reference to FIGS. 7-11. For simplicity, only the formation of conductor lines on a dielectric layer for coupling to contact regions of the active area of the device will be described. It will be appreciated that other steps used in the manufacture of a power semiconductor device, such as forming the active area of the device, are well known and so will not be described further herein.

Figure 7:
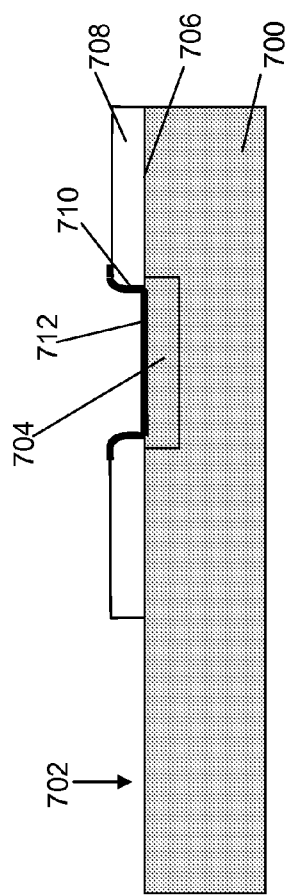
FIGS. 7-11 are schematic cross-section diagrams of a portion of the high power semiconductor device of FIG. 4 during different stages of fabrication according to an example method in accordance with an embodiment of the disclosure.

As shown in FIG. 7, a semiconductor substrate 700 is provided including an active area of a high power semiconductor device. The active area is indicated by the reference numeral 702 in FIG. 7. In an example when the high power semiconductor device is a RF power transistor device, the active area 702 includes regions and/or layers of various materials formed in the semiconductor substrate 700 that provide the transistor functions. The semiconductor substrate described herein can be any semiconductor material or combinations of materials, such as gallium nitride, silicon carbide, gallium arsenide, silicon-on-insulator (SOI), silicon, monocrystalline silicon, or any other type of semiconductor material, and combinations of the above. A doped region 704 may be formed in the semiconductor substrate 700 extending from a surface 706 of the semiconductor substrate 700. In an example and as shown in FIG. 7, a passivation layer 708, which may be a silicon nitride or similar layer, is formed over the surface 706 of the semiconductor substrate 700 to act as an insulator and is patterned and etched to provide an opening 710 extending to the doped region 704. Metal is then deposited into the opening 710 so as to provide a contact region 712 which provides a contact to the active area 702. It will be appreciated that although only one contact region is shown in FIG. 7, a plurality of such contact regions 712 may be formed over the surface 706 of the semiconductor substrate 700.

Figure 8:
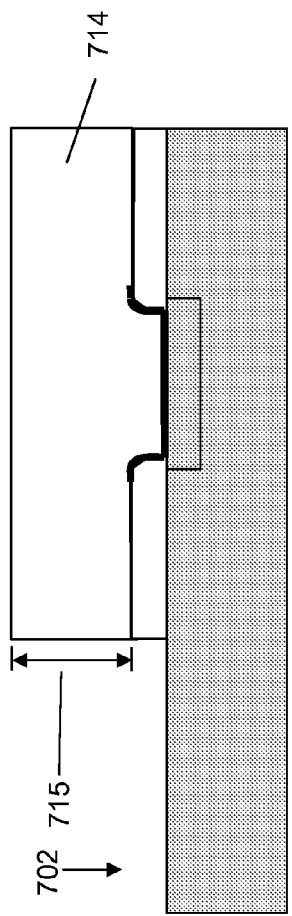

A dielectric layer 714 is then formed over the semiconductor substrate 700 and contact region 712, FIG. 8. The dielectric layer 714 may be formed from a layer of dielectric material such as SU-8 which is a negative, epoxy-type, near-UV photoresist based on EPON SU-8 epoxy resin that is supplied by MicroChem Inc. and which may be spun-on or grown on the semiconductor substrate 700. Other dielectric materials may be used, such as positive photoresist material.

When conductor lines are formed close to a semiconductor substrate, EM losses, due to dielectric losses though the semiconductor substrate and to ohmic losses of the conductor lines, can significantly impact device performance. In order to reduce EM losses through the semiconductor substrate 700, the dielectric layer 714 is arranged to be a thick layer. In an example which uses a silicon substrate having a relatively low resistivity of 10 milliohm cm, the dielectric layer 714 may have a thickness 715 of greater than 60 microns. The minimum thickness of the dielectric layer 714 which is required to ensure that the device meets the performance requirements based on EM losses (e.g. the Q factor of the inductors formed by the conductor lines is high enough) can depend on the material of the semiconductor substrate 700. If the resistivity of the semiconductor substrate 700 can be increased, the thickness of the dielectric layer can be reduced. Thus, for different substrates the dielectric layer 714 may not need to be as thick as 60 microns. Dielectric materials other than SU-8 which can provide thick dielectric layers may be used instead. For example, a dielectric layer comprising an air gap or a plurality of air gaps formed in a material may be used.

Figure 9:
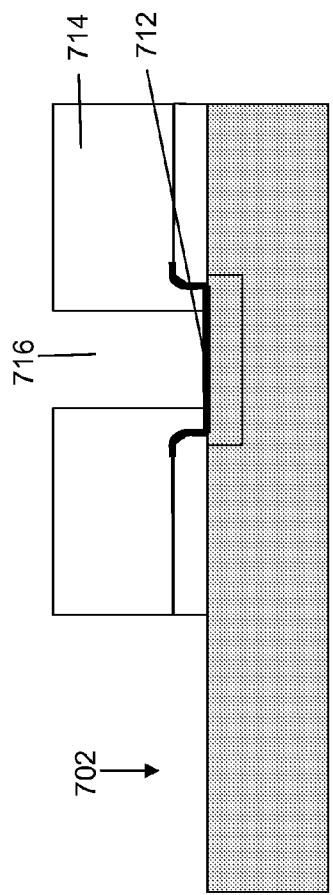
Figure 10:
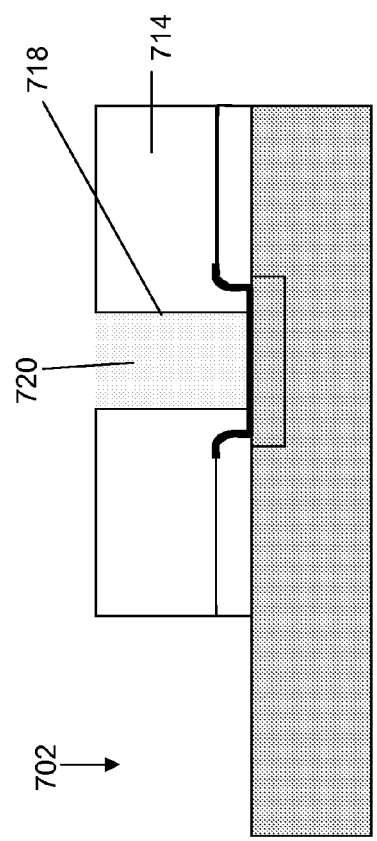
Figure 11:
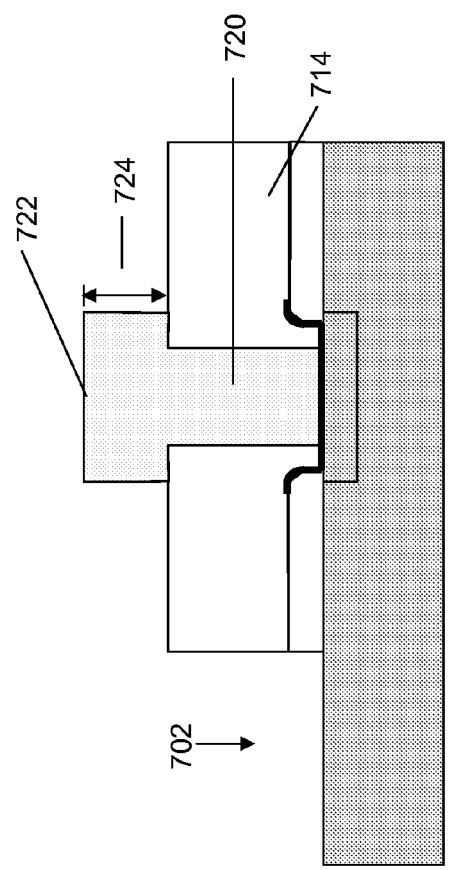

As shown in FIG. 9, the dielectric layer 714 is then patterned and etched to provide an opening or via 716 extending through the dielectric layer 714 to the contact region 712. A plurality of openings 716 are formed at locations across the semiconductor substrate 700 where connections to the active area 702 are to be made. Conductive material 720 is then formed in the openings 716, FIG. 10. The conductive material may include a metal such as copper, gold, aluminium or metal alloy, and may be formed by deposition, evaporation, sputtering plating by electrolytic or electroless processes or other similar techniques. In order to ensure that the conductive material 720 once it has been formed in the opening 716 is level with a top surface 718 of the dielectric layer 714, the conductive material 720 can be lapped to provide a clean conductive region 720 extending through the dielectric layer 714. Other processes can be used to provide the same result.

A mask (not shown), such as a photoresist mask, is then formed over the semiconductor substrate 700. This mask is used to define the location of the conductor lines over the semiconductor substrate 700, which conductor lines are to provide high power connections to the contract regions 712 of the active area 702 by means of the conductive regions 720. A conductive material is then formed on the dielectric layer 714 in the locations defined by the mask to form the conductor lines 722. The conductive material may include a metal such as copper, gold, aluminium or metal alloy, and may be formed by deposition, evaporation, sputtering, plating by electrolytic or electroless processes or other similar techniques. In an example, the conductor lines 722 are printed on the dielectric layer 714 and are formed of copper and at least one of the conductor lines has a thickness 724 of greater than 30 microns. Thicker conductor lines have reduced resistivity which reduces the EM losses due to ohmic losses and thus improves device performance (e.g. by increasing the Q factor of the inductors formed by the conductor lines).

Thus, the conductor lines 722 are formed on the dielectric layer 714 and are coupled to the contract regions 712 of the active area 702 by the conductive regions 720 to provide high power connections to the contact regions.

In an example having a dielectric layer 412 comprising an air gap or a plurality of air gaps, further steps may be performed to remove part or all of the SU-8 dielectric layer 412 so as to provide a dielectric layer with a plurality of air gaps or an 'air' dielectric layer.

Figure 12:
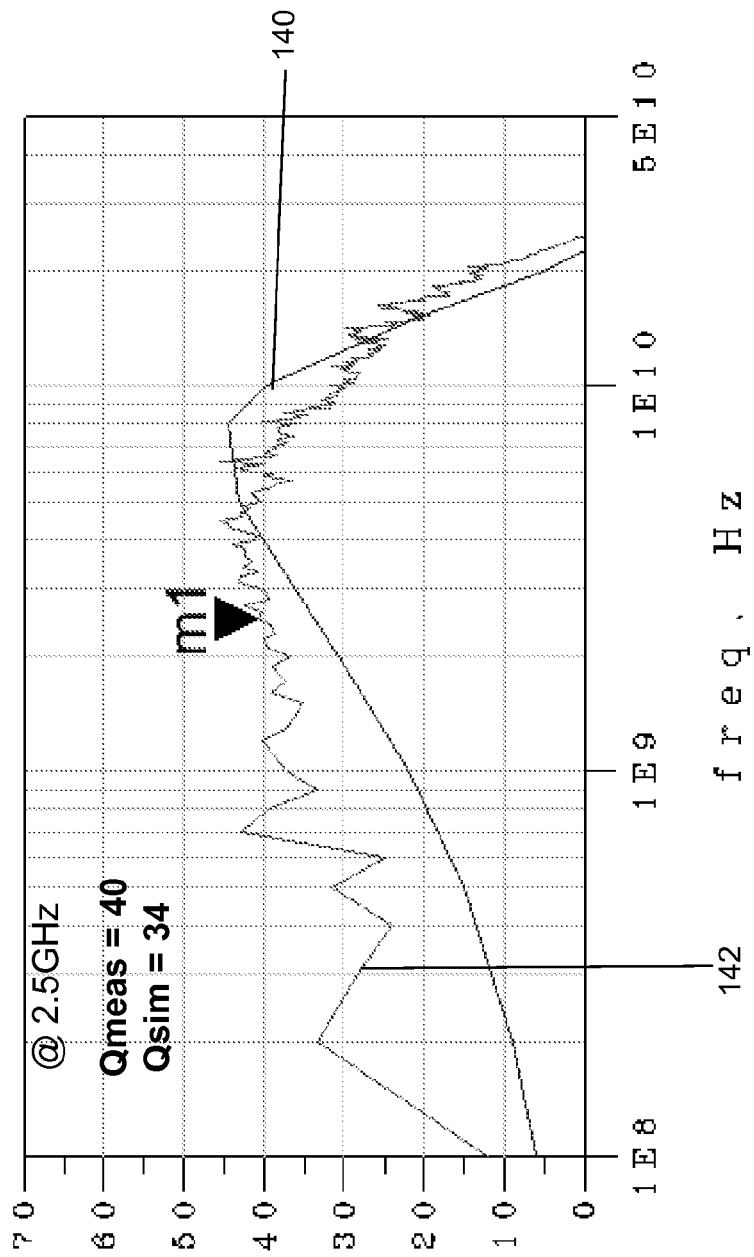
FIG. 12 is a graph showing the variation of the Q factor with frequency for a conductor line formed in accordance with the method shown in FIGS. 7-11.

FIG. 12 is a graph showing the variation of the Q factor at 2.5 GHz of a 35 micron conductor line formed on a 60 micron SU-8 dielectric layer and extending in a serpentine shape (such as the conductor lines shown in the device 606 of FIG. 6) across the dielectric layer a distance. Curve 140 represents the simulated Q factor and curve 142 represents the measured Q factor. From FIG. 12, it can be seen that Q factors in the range of 40 at 2 GHz can be obtained which is in line with the requirements for high power RF transistor devices at powers of greater than 5 Watts.

Thus, the high power semiconductor device described above uses integrated conductor lines formed on a semiconductor substrate to provide connections to the active area of the device and to act as impedance matching components for impedance matching and thus, avoids the need to use wire bonds for at least the connections to the active area of the device. By integrating or printing the conductor lines on a semiconductor substrate, the manufacture of the conductor lines is simpler and more easily controllable (e.g. the tolerances are much smaller and parameters such as thickness of the lines can be more easily controlled) compared to forming wire bond connections. For example, as shown in FIG. 6, different shapes can be achieved more easily for printed conductor lines compared to wire bonds to optimise the coupling between adjacent conductor lines. Since the manufacture of the conductor lines is more easily controllable compared to the manufacture of wire bonds, it is easier to meet higher specifications for device performance and reduce the performance variability from device to device compared to devices which use wire bonds connections to the active area. Furthermore, the use of conductor lines formed on a semiconductor substrate makes it easier to combine the high power semiconductor device with other components (e.g. switching components, digital components) compared to devices which use wire bonds where more complex wiring may be required.

In an example, the conductor lines are formed on a thick (greater than 50 microns) dielectric layer and at least one is thick, having a thickness greater than 30 microns, which reduces the EM losses and results in the conductor lines having a high Q factor at high power and over frequencies ranging from a few MHz to several GHz.

It will be appreciated that the invention may be used in any wireless applications, such as RF or microwave, such as telecommunication applications, radar applications, heating applications, medical applications, where there is a need for high power semiconductor devices that have low loss and meets the requirements for impedance matching.

In the foregoing specification, the invention has been described with reference to specific examples of embodiments of the invention. It will, however, be evident that various modifications and changes may be made therein without departing from the broader scope of the invention as set forth in the appended claims.

The conductors as discussed herein may be illustrated or described in reference to being a single conductor, or a plurality of conductors carrying similar or different currents or signals. However, different embodiments may vary the implementation of the conductors. As a function of an application's, current handling capability requirement, available space and coupling strategy, a plurality of conductors may be replaced with a single wider conductor. Likewise, single conductors may be separated out into various different conductors carrying subsets of the signal.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A high power semiconductor device for operation at powers greater than 5 watts for wireless applications comprising:
   a semiconductor substrate comprising a semiconductor material, said semiconductor substrate including an active area of the high power semiconductor device;

contact regions formed on the semiconductor substrate providing contacts to the active area of the high power semiconductor device;

a dielectric layer formed over a part of the semiconductor substrate;

a lead for providing an external connection to the high power semiconductor device;

an impedance matching network formed on the semiconductor substrate between the active area of the high power semiconductor device and the lead, wherein the impedance matching network includes conductor lines formed on the dielectric layer and being coupled to the contact regions for providing high power connections to the contact regions of the active area, the conductor lines having a predetermined inductance for impedance matching.

2. The high power semiconductor device according to claim 1, wherein the conductor lines have a Q factor which is greater than 40 at device operating powers of greater than 5 Watts and at 2 GHz, with the predetermined inductance of at least one of the conductor lines being less than 1 nano Henry.

3. The high power semiconductor device according to claim 1, wherein the conductor lines extend between the contact regions of the active area and the lead.

4. The high power semiconductor device according to claim 3, wherein each of the conductor lines is arranged to have a predetermined shape extending over the dielectric layer, wherein the predetermined shape is selected to optimize the coupling between adjacent conductor lines so as to control the inductance of the conductor lines and provide the predetermined inductance.

5. The high power semiconductor device according to claim 1, wherein the impedance matching network further comprises another impedance matching component formed on the semiconductor substrate between the lead and the contact regions, wherein the conductor lines extend at least between the contact regions and the another impedance matching component.

6. The high power semiconductor device according to claim 5, wherein the impedance matching component includes a capacitor formed on the semiconductor substrate.

7. The high power semiconductor device according to claim 1, wherein each of the conductor lines is arranged to have a predetermined shape extending over the dielectric layer, wherein the predetermined shape is selected to optimise the coupling between adjacent conductor lines so as to control the inductance of the conductor lines and provide the predetermined inductance.

8. The high power semiconductor device according to claim 1, wherein the conductor lines extend over a portion of a top surface of the semiconductor substrate and do not extend beyond the top surface of the semiconductor substrate.

9. The high power semiconductor device according to claim 1, further comprising conductive regions extending through the dielectric layer to the contact regions for coupling the conductor lines to the contact regions.

10. The high power semiconductor device according to claim 1, further comprising a shielding layer formed between the semiconductor substrate and the dielectric layer.

11. The high power semiconductor device according to claim 10, further comprising a conductive layer formed on a bottom surface of the semiconductor substrate and wherein the shielding layer is coupled to the conductive layer.

12. The high power semiconductor device according to claim 1, wherein at least one of the conductor lines has a thickness greater than 30 microns.

13. A method of forming a high power semiconductor device for operation at powers greater than 5 watts for wireless applications comprising:

providing a semiconductor substrate comprising a semiconductor material, said semiconductor substrate including an active area of the high power semiconductor device and contact regions formed on the semiconductor substrate providing contacts to the active area of the high power semiconductor device;

forming a dielectric layer over part of the semiconductor substrate and contact regions;

forming an impedance matching network on the semiconductor substrate; and forming a lead for providing an external connection to the high power semiconductor device, wherein the impedance matching network is formed between the active area of the high power semiconductor device and the lead, and wherein forming an impedance matching network comprises forming conductor lines on the dielectric layer coupled to the contact regions for providing high power connections to the contact regions of the active area, the conductor lines having a predetermined inductance for impedance matching.

14. The method according to claim 13, wherein forming a plurality of conductor lines includes printing the plurality of conductor lines on the dielectric layer.

15. The method according to claim 14, further comprising selecting configuration parameters of the dielectric layer and the conductor lines such that the conductor lines have a Q factor which is greater than 40 at 2 GHz, with the predetermined inductance of at least one of the conductor lines being less than 1 nano Henry, wherein the configuration parameters of the dielectric layer include permittivity of material forming the dielectric layer, a thickness of the dielectric layer and the loss tangent of the dielectric layer, and the configuration parameters of the conductor lines include resistivity of material forming the conductor lines and a cross-section area of the conductor lines.

16. The method according to claim 13, further comprising selecting configuration parameters of the dielectric layer and the conductor lines such that the conductor lines have a Q factor which is greater than 40 at 2 GHz, with the predetermined inductance of at least one of the conductor lines being less than 1 nano Henry, wherein the configuration parameters of the dielectric layer include permittivity of material forming the dielectric layer, a thickness of the dielectric layer and the loss tangent of the dielectric layer, and the configuration parameters of the conductor lines include resistivity of material forming the conductor lines and a cross-section area of the conductor lines.

17. The method according to claim 16, wherein the selecting configuration parameters of the dielectric layer and the conductor lines is dependent on resistivity of material forming the semiconductor substrate.

18. The method according to claim 13, wherein forming conductor lines comprises forming conductor lines on the dielectric layer extending over a portion of a top surface of the semiconductor substrate and not extending beyond the top surface of the semiconductor substrate.

19. The method according to claim 13, further comprising forming a shielding layer between the semiconductor substrate and the dielectric layer.

20. The method according to claim 19, further comprising forming a conductive layer on a bottom surface of the semiconductor substrate and wherein the shielding layer is coupled to the conductive layer.

* * * * *